US008322828B2

(12) United States Patent
Ohashi et al.

(10) Patent No.: US 8,322,828 B2
(45) Date of Patent: Dec. 4, 2012

(54) LIQUID EJECTION HEAD AND LIQUID JET APPARATUS

(75) Inventors: Koji Ohashi, Chino (JP); Setsuya Iwashita, Nirasaki (JP); Eiji Osawa, Chino (JP)

(73) Assignee: Seiko Epson Corporation (JP)

( * ) Notice: Subject to any disclaimer, the term of this patent is extended or adjusted under 35 U.S.C. 154(b) by 291 days.

(21) Appl. No.: 12/499,415

(22) Filed: Jul. 8, 2009

(65) Prior Publication Data

US 2010/0020133 A1 Jan. 28, 2010

(30) Foreign Application Priority Data

Jul. 25, 2008 (JP) ................................ 2008-192462

(51) Int. Cl.

| | |
|---|---|
| ***B41J 2/045*** | (2006.01) |
| ***H02N 2/00*** | (2006.01) |
| ***H01L 41/187*** | (2006.01) |
| ***C04B 35/00*** | (2006.01) |

(52) U.S. Cl. .................. 347/68; 310/358; 252/62.9 PZ; 252/62.9 R

(58) Field of Classification Search ........................ None
See application file for complete search history.

(56) References Cited

U.S. PATENT DOCUMENTS 7,208,044 B2 * 4/2007 Zurbuchen ...................... 117/94
7,291,960 B2 * 11/2007 Iwashita et al. ............... 310/363

FOREIGN PATENT DOCUMENTS

| | | |
|---|---|---|
| JP | 2000-158648 | 6/2000 |
| JP | 2005-33207 | 2/2005 |
| JP | 2006-186259 | 7/2006 |
| JP | 2006-253476 | 9/2006 |
| JP | 2006-253477 | 9/2006 |
| JP | 2007-134566 | 5/2007 |
| JP | 2007134566 A * | 5/2007 |

OTHER PUBLICATIONS

Thermodynamic analysis of the ternary La-Ni-O system, Journal of Alloys and Compounds 375 (2004) 147-161, Zinkevich et al.*
The Metal-Organic CVD of Lanthanum Nickelate Electrodes for Use in Ferroelectric Devices, Chem. Vap. Deposition 2003, 9, No. 2 (2003), Lane et al.*

* cited by examiner

*Primary Examiner* — Matthew Luu
*Assistant Examiner* — Erica Lin
(74) *Attorney, Agent, or Firm* — Harness, Dickey & Pierce, P.L.C.

(57) ABSTRACT

A liquid jet head includes: a nozzle plate having a nozzle opening; a pressure chamber substrate having a pressure chamber communicating with the nozzle opening and formed above the nozzle plate; a vibration formed on one side of the pressure chamber substrate; and a piezoelectric element formed above the vibration plate and provided at a position corresponding to the pressure chamber, wherein the piezoelectric element includes two electrodes, a piezoelectric layer provided between the electrodes, and an orientation layer that is provided between one of the electrodes closer to the vibration plate and the piezoelectric layer, wherein the orientation layer includes a mixed crystal of lanthanum nickelate, and the lanthanum nickelate included in the mixed crystal is expressed by a formula $La_xNi_yO_z$, where x is an integer of any of 1 to 3, y is 1 or 2, and z is an integer of any of 2 to 7.

8 Claims, 13 Drawing Sheets

$La_1Ni_1O_2 + La_1Ni_1O_3 + La_2Ni_1O_4 + La_3Ni_2O_7$

LIQUID EJECTION HEAD AND LIQUID JET APPARATUS

CROSS-REFERENCE TO RELATED APPLICATIONS

This application claims the benefit of priority to Japanese Patent Application No. 2008-192462 filed Jul. 25, 2008, the contents of which are hereby incorporated by reference in their entirety.

BACKGROUND

1. Technical Field

The present invention relates to liquid ejection heads and liquid jet apparatuses.

2. Related Art

Ink jet printers are known as printers that can realize high image quality and high speed printing. In order to improve the characteristics of piezoelectric elements in liquid jet heads for ink jet printers, it is important to control the crystal orientation of the piezoelectric layers.

As a method to control the crystal orientation of a piezoelectric layer, a control method that uses a substrate of MgO (100) single crystal is known (see, for example, Japanese Laid-open patent application JP-A-2000-158648). However, according to this method, the process for manufacturing a liquid jet head may become complex.

SUMMARY

In accordance with an advantage of some aspects of the invention, liquid ejection heads with excellent aging characteristics can be provided.

In accordance with another advantage of some aspects of the invention, liquid jet apparatuses including the liquid ejection heads described above can be provided.

In accordance with an embodiment of the invention, a liquid jet head includes: a pressure chamber substrate having a pressure chamber; a vibration plate provided at one side of the pressure chamber substrate; a piezoelectric element that is provided above the vibration plate and at a position corresponding to the pressure chamber; and a nozzle plate that is provided on the other side of the pressure chamber substrate and has a nozzle aperture communicating with the pressure chamber, wherein the piezoelectric element includes a lower electrode, an orientation layer that is formed above the lower electrode, a piezoelectric layer that is formed above the orientation layer, and an upper electrode that is formed above the piezoelectric layer, wherein the orientation layer includes a mixed crystal of lanthanum nickelate, wherein the lanthanum nickelate included in the mixed crystal is expressed by a formula $La_xNi_yO_z$, where x is an integer of any of 1 to 3, y is 1 or 2, and z is an integer of any of 2 to 7.

According to the invention, it is possible to provide a liquid jet head having piezoelectric elements with excellent piezoelectric characteristics due to the provision of the specific orientation layer, which can realize high-density printing and high-speed printing, and has excellent aging characteristics.

In the description of the invention, the term "above" is used, for example, as "a specific component (hereinafter referred to as 'B') is formed 'above' another specific component (hereinafter referred to as 'A')." In such a case, the term "above" is used in the description of the invention, while assuming to include the case where the component B is formed directly on the component A and the case where the component B is formed over the component A through another component provided on the component A.

In the liquid jet head in accordance with an aspect of the invention, the mixed crystal may be composed of two or more kinds of lanthanum nickelate selected from $LaNiO_2$, $LaNiO_3$, $La_2NiO_4$ and $La_3Ni_2O_7$.

In the liquid jet head in accordance with an aspect of the invention, the mixed crystal may have a peak top position of a peak between 21° and 25° in diffraction angles 2θ when examined by X-ray diffractometry according to a θ-2θ method using CuK α ray. It is noted here that the "peak top position" indicates an apex of the peak originated from the mixed crystal. Moreover, when an integrated value of intensity of the peak from the peak top position to 21° is $I_A$, and an integrated value of intensity of the peak from the peak top position to 25° is $I_B$, a relation $I_A>I_B$ or $I_A<I_B$ may be established. Also, in this instance, the mixed crystal may include $LaNiO_2$, $LaNiO_3$ and $La_2NiO_4$. Further, in this instance, the mixed crystal has a molar ratio of lanthanum to nickel (La/Ni) that is 1.5 or lower.

In the liquid jet head in accordance with an aspect of the invention, the mixed crystal may have a peak top position of a peak between 30° and 34° in diffraction angles 2θ when examined by X-ray diffractometry according to a θ-2θ method using CuK α ray. Moreover, when an integrated value of intensity of the peak from the peak top position to 30° is $I_C$, and an integrated value of intensity of the peak from the peak top position to 33° is $I_D$, a relation $I_C>I_D$ or $I_C<I_D$ may be established. Also, in this instance, the mixed crystal may include $LaNiO_2$, $LaNiO_3$, $La_2NiO_4$ and $La_3Ni_2O_7$. Further, in this instance, the mixed crystal has a molar ratio of lanthanum to nickel (La/Ni) that is 1.5 or greater.

A liquid ejection apparatus in accordance with an embodiment of the invention includes: a media transfer mechanism that supplies and transfers a medium on which droplets are to be jetted; and a control section that supplies droplets from the liquid jet head at specified positions on the medium supplied by the media transfer mechanism.

DESCRIPTION OF EXEMPLARY EMBODIMENTS

Preferred embodiments of the invention are described below with reference to the accompanying drawings.

1. LIQUID JET HEAD

Figure 1:
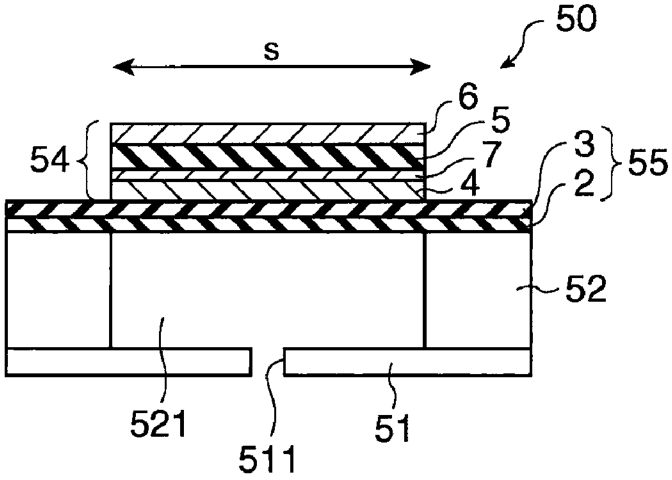
FIG. 1 is a schematic cross-sectional view in part of a liquid jet head in accordance with an embodiment of the invention.
Figure 2:
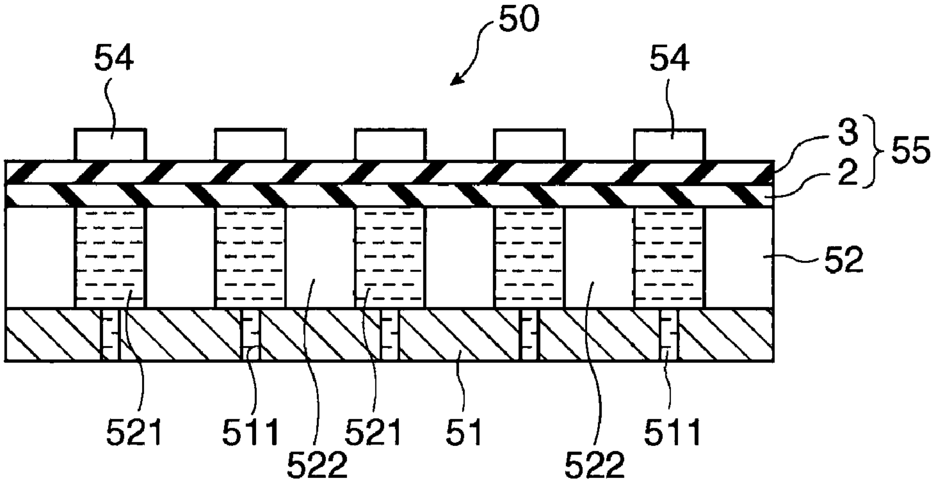
FIG. 2 is a schematic cross-sectional view of the liquid jet head in accordance with the present embodiment.
Figure 3:
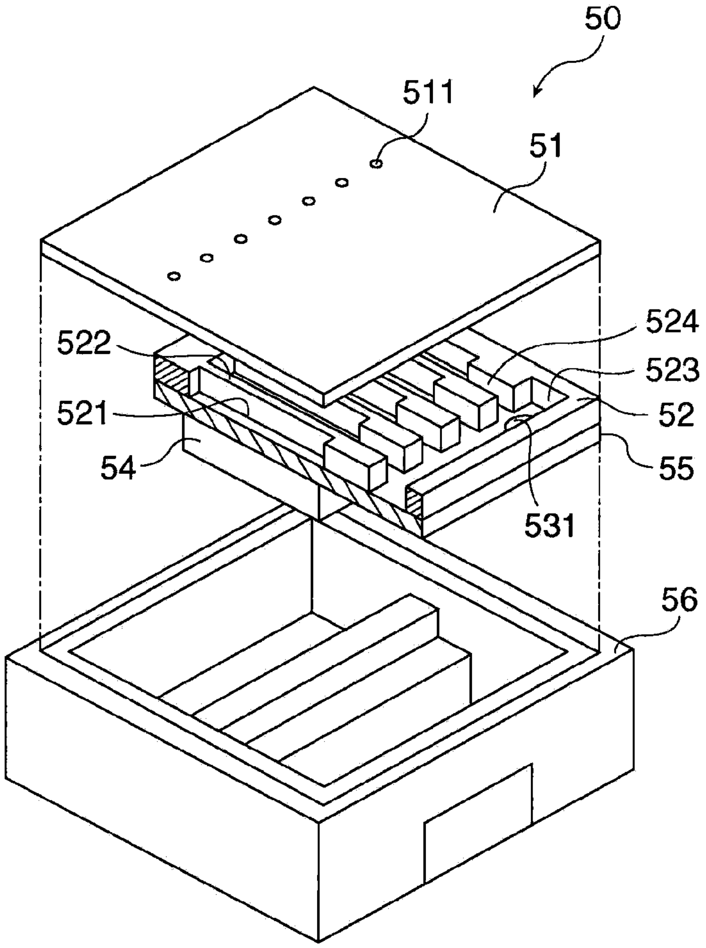
FIG. 3 is a schematic exploded perspective view of the liquid jet head in accordance with the present embodiment.

FIG. 1 is a schematic cross-sectional view in part of a liquid jet head in accordance with an embodiment of the invention. FIG. 2 is a schematic cross-sectional view of the liquid jet head in accordance with the present embodiment. FIG. 3 is a schematic exploded perspective view of the structure of the liquid jet head in accordance with the present embodiment. It is noted that FIG. 3 shows the liquid jet head upside down with respect to a state in which it is normally used.

A liquid jet head 50 in accordance with the present embodiment is housed and fixed in a base substrate 56, as shown in FIG. 3. The base substrate 56 is formed from, for example, any one of various resin materials, any one of various metal materials, or the like. The liquid jet head 50 forms an on-demand type piezoelectric jet head.

As shown in FIG. 1 and FIG. 2, the liquid jet head 50 is equipped with a pressure chamber substrate 52 having pressure chambers (cavities) 521, a vibration plate 55 provided on one side of the pressure chamber substrate 52, piezoelectric elements 54 that are provided above the vibration plate 55 at locations corresponding to the pressure chambers 521, and a nozzle plate 51 that is provided on the other side of the pressure chamber substrate 52 and has nozzle apertures 511 communicating with the respective pressure chambers 521.

Each of the pressure chambers 521 is provided in a manner to correspond to each of the corresponding nozzle apertures 511, as shown in FIG. 2. The pressure chamber 521 has a volume that is variable by vibrations of the vibration plate 55. The pressure chamber 521 is structured to eject liquid such as ink or disperse medium by the volume change. For obtaining the pressure chamber substrate 52, a silicon single-crystal substrate with a (110) orientation may be used. The silicon single-crystal substrate with a (110) orientation is suitable for anisotropic etching, such that the pressure chamber substrate 52 can be readily and securely formed by etching.

The vibration plate 55 is affixed to one side of the pressure chamber substrate 52, as shown in FIG. 1 and FIG. 2. The vibration plate 55 may have a dielectric layer 2 and an elastic layer 3 formed on the dielectric layer 2. As a material for the dielectric layer 2, for example, silicon oxide may be used. The dielectric layer 2 may function as an etching stopper, for example, in the step of etching the pressure chamber substrate 52 from its back side for forming the pressure chambers 521 of the liquid jet head 50. As a material for the elastic layer 3, for example, yttria-stabilized zirconia, cerium oxide, zirconium oxide or the like may be used.

The nozzle plate 51 is formed from, for example, a rolled plate of stainless steel or the like, and includes multiple nozzle apertures 511 formed in a row for jetting droplets. The pitch of the nozzle apertures 511 may be appropriately set according to the printing resolution.

The nozzle plate 51 is bonded (affixed) to the other side of the pressure chamber substrate 52. The pressure chamber substrate 52 has a plurality of pressure chambers 521, a reservoir 523, and supply ports 524, which are defined by the nozzle plate 51, side walls (partition walls) 522 and the vibration plate 55, as shown in FIG. 2 and FIG. 3. The reservoir 523 may temporarily reserve ink that is supplied from an ink cartridge 631 (see FIG. 9). The ink is supplied from the reservoir 523 to the respective pressure chambers 521 through the supply ports 524.

Next, the piezoelectric elements 54 are described.

Each of the piezoelectric elements 54 is electrically connected to a piezoelectric element driving circuit to be described below, and is structured to operate (vibrate, deform) based on signals provided by the piezoelectric element driving circuit. In other words, each of the piezoelectric elements 54 functions as a vibration source (piezoelectric device). The elastic layer 55 vibrates (deforms) by vibration (deformation) of the piezoelectric element 54, and functions to instantaneously increase the inner pressure of the pressure chamber 521.

The piezoelectric element 54 has a lower electrode 4, an orientation layer 7, a piezoelectric layer 5 and an upper electrode 6, as shown in FIG. 1.

The lower electrode 4 is one of electrodes for impressing a voltage to the piezoelectric layer 5. The lower electrode 4 may be formed from any material without any particular limitation as long as its conductivity is secured.

The lower electrode 4 may preferably be formed from a conductive material having a lower specific resistance compared to the orientation layer 7. The material for the lower electrode 4 can include at least one of, for example, a metal, an oxide of the metal, and an alloy composed of the metal. Also, the lower electrode 4 may have a structure in which plural conductive layers are laminated. It is noted that, for example, at least one of Pt, Ir, Ru, Ag, Au, Cu, Al and Ni can be used as the metal. For example, $IrO_2$ and $RuO_2$ may be enumerated as the oxide of the metal. For example, Pt—Ir, Ir—Al, IrTi, Pt—Ir—Al, Pt—Ir—Ti and Pt—Ir—Al—Ti may be enumerated as the alloy composed of the metal. In accordance with the present embodiment, the crystal orientation of the conductive material is not particularly limited, and, for example, can be in a (111) orientation. The film thickness of the lower electrode 4 may be, for example, about 50 nm to about 200 nm.

The orientation layer 7 includes a mixed crystal of lanthanum nickelate. In other words, the orientation layer 7 includes plural types of lanthanum nickelate. The orientation layer 7 can control the crystal orientation of the piezoelectric layer 5 to a specified orientation, and can improve the characteristics of the piezoelectric layer, such as, the piezoelectric constant and the like. Moreover, by providing the orientation layer 7 including a specified mixed crystal, the aging characteristic of the liquid jet head 50 can be considerably improved. Also, the orientation layer 7 has conductivity, and thus can also serve as an electrode.

Lanthanum nickelate included in the mixed crystal is expressed by a formula, $La_xNi_yO_z$, where x may be any one of integers from 1 to 3, y may be 1 or 2, and z may be any one of integers from 2 to 7. More concretely, the mixed crystal includes two or more kinds of lanthanum nickelate selected from $LaNiO_2$, $LaNiO_3$, $La_2NiO_4$ and $La_3Ni_2O_7$. The orientation layer 7 may further include, for example, a silicon compound, a small amount of another kind of lanthanum nickelate or the like.

The inventors named in the present application have confirmed that lanthanum nickelate contained in the mixed crystal depended on a method for forming the orientation layer 7, as described below.

For example, when the orientation layer 7 is formed by a rotary magnetron sputter method, compositions of the mixed crystal become different depending on the film forming temperature. For example, when the film formation is conducted between 150° C. and 250° C., the obtained mixed crystal includes, as main constituents, $LaNiO_2$, $LaNiO_3$ and $La_2NiO_4$.

When the film formation is conducted at such relatively low temperatures, the mixed crystal has a peak top position of a peak between 21° and 25° in diffraction angles 2θ when examined by X-ray diffractometry according to a θ-2θ method using CuK α ray. Moreover, when an integrated value of intensity of the peak from the peak top position to 21° is $I_A$, and an integrated value of intensity of the peak from the peak top position to 25° is $I_B$, a relation $I_A>I_B$ or $I_A<I_B$ may be established. The fact that $I_A$ and $I_B$ have the foregoing relation indicates that the peak obtained by the θ-2θ method is asymmetrical with respect to the peak top position, and means that the peak originate from a mixed crystal. When a peak obtained by the θ-2θ method is symmetrical with respect to the peak top position, the peak originates from a single axial orientation of $LaNiO_3$. Such relations between $I_A$ and $I_B$ are similarly applied to other peaks to be described below. Furthermore, in the case of this film formation, the mixed crystal has a molar ratio of lanthanum to nickel (La/Ni) that is 1.5 or smaller, and more preferably, 1 or greater but 1.5 or smaller.

Also, when a mixed crystal is formed at relatively high temperatures, for example, between 400° C. and 600° C., the mixed crystal includes, as main constituents, $LaNiO_2$, $LaNiO_3$, $La_2NiO_4$ and $La_3Ni_2O_7$. In this case, the mixed crystal has a peak between 30° and 33° in diffraction angles 2θ when examined by X-ray diffractometry according to a θ-2θ method using CuK α ray. When an integrated value of intensity of the peak from the peak top position to 30° is $I_C$, and an integrated value of intensity of the peak from the peak top position to 33° is $I_D$, a relation $I_C>I_D$ or $I_C<I_D$ may be established. Further, in this instance, the mixed crystal has a molar ratio of lanthanum to nickel (La/Ni) that is 1.5 or greater, and more preferably, 1.5 or greater but 2 or smaller.

The piezoelectric layer 5 is composed of a piezoelectric material having a perovskite structure. The piezoelectric layer 5 is in contact with the orientation layer 7. The piezoelectric material composing the piezoelectric layer 5 may be in a rhombohedral crystal or a mixed crystal of tetragonal and rhombohedral crystals, and may preferably be oriented to (100). The piezoelectric layer 5 composed of such a piezoelectric material generally has a high piezoelectric constant.

The piezoelectric material can be expressed by, for example, a general formula $ABO_3$. It is noted that A may include Pb, and B may include at least one of Zr and Ti. Further, B may also include at least one of V, Nb and Ta. In this case, the piezoelectric material can include at least one of Si and Ge. More concretely, the piezoelectric material may include at least one of lead zirconate titanate ($Pb(Zr, Ti)O_3$), lead zirconate titanate niobate ($Pb(Zr, Ti, Nb)O_3$), lead lanthanum titanate ($(Pb, La)TiO_3$), lead lanthanum zirconate titanate ($(Pb, La)ZrTiO_3$), lead magnesium niobate titanate ($Pb(Mg, Nb)TiO_3$), lead magnesium niobate zirconate titanate ($Pb(Mg, Nb)(Zr, Ti)O_3$), lead zinc niobate titanate ($Pb(Zn, Nb)TiO_3$), lead scandium niobate titanate ($Pb(Sc, Nb)TiO_3$), lead nickel niobate titanate ($Pb(Ni, Nb)TiO_3$), and lead indium magnesium niobate titanate ($Pb(In, Mg, Nb)TiO_3$).

Also, the piezoelectric material may be formed from at least one of $(Ba_{1-x}Sr_x)TiO_3 (0 \leqq x \leqq 0.3)$, $Bi_4Ti_3O_{12}$, $SrBi_2Ta_2O_9$, $LiNbO_3$, $LiTaO_3$ and $KNbO_3$.

The film thickness of the piezoelectric layer 5 may be, for example, about 0.1 μm or more but 5 μm or less.

The upper electrode 6 is the other of the electrodes for impressing a voltage to the piezoelectric layer 5. The same material used for the lower electrode 4 may be used as the material for the upper electrode 6. Also, the upper electrode 6 may be formed from a laminate of plural conductive layers. For example, the upper electrode 6 may be formed from a laminate of a conductive oxide layer and a metal layer.

Next, operations of the liquid jet head 50 in accordance with the present embodiment are described. In the liquid jet head 50 in accordance with the present embodiment, in a state in which a predetermined jetting signal is not inputted through the piezoelectric element driving circuit, in other words, in a state in which no voltage is applied across the lower electrode 4 and the upper electrode 6 of the piezoelectric element 54, no deformation occurs in the piezoelectric layer 5, as shown in FIG. 1. Therefore, no strain occurs in the vibration plate 55, and no volume change occurs in the pressure chamber 521. Accordingly, no ink droplet is discharged from the nozzle aperture 511.

Figure 4:
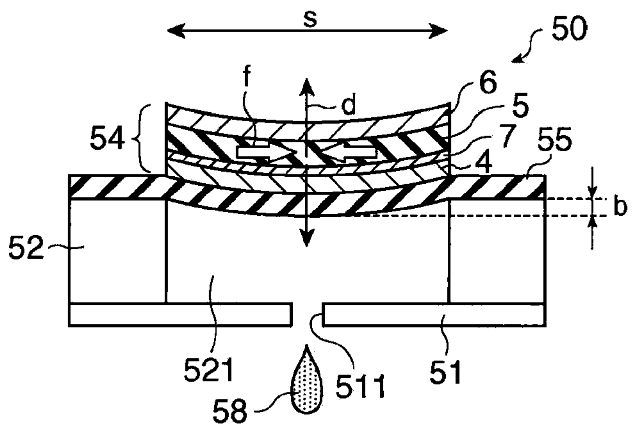
FIG. 4 is a view for describing operations of a liquid jet head in accordance with an embodiment of the invention.

On the other hand, in a state in which a predetermined jetting signal is inputted through the piezoelectric element driving circuit, in other words, in a state in which a predetermined voltage is impressed across the lower electrode 4 and the upper electrode 6 of the piezoelectric element 54, a deflection deformation occurs in the piezoelectric layer 5 in its minor axis direction (in a direction indicated by an arrow s shown in FIG. 4). By this, the vibration plate 55 flexes, thereby causing a change in the volume of the pressure chamber 521. At this moment, the pressure within the pressure chamber 521 instantaneously increases, and an ink droplet 58 is discharged from the nozzle aperture 511.

In other words, when the voltage is impressed, the crystal lattice of the piezoelectric layer 5 is extended in a direction perpendicular to its surface (in a direction indicated by an arrow d shown in FIG. 4), but at the same time compressed in a direction along the surface. In this state, a tensile stress f works in-plane in the piezoelectric layer 5. Therefore, this tensile stress f bends and flexes the vibration plate 55. The larger the amount of displacement (in an absolute value) of the piezoelectric layer 5 in the direction of the minor axis of the pressure chamber 521, the more the amount of flex of the vibration plate 55 becomes, and the more effectively a droplet of liquid material (hereafter also referred to as "liquid") such as ink can be discharged.

When an ejection of liquid has been completed, the piezoelectric element driving circuit stops application of the voltage across the lower electrode 4 and the upper electrode 6. By this, the piezoelectric element 54 returns to its original shape, shown in FIG. 1, and the volume of the pressure chamber 521 increases. It is noted that, at this moment, a pressure (pressure in a positive direction) works on the liquid in a direction from the container for storing the liquid (for example, an ink cartridge 631 (see FIG. 9)) toward the nozzle aperture 511. For this reason, air is prevented from entering the pressure chamber 521 from the nozzle aperture 511, and an amount of liquid matching with the jetting amount of liquid is supplied from the ink cartridge 631 through the reservoir 523 to the pressure chamber 521.

In this manner, by successively inputting jetting signals through the piezoelectric element driving circuit to the piezoelectric elements 54 at positions where droplets are to be jetted, droplets can be supplied at desired locations on a medium to which droplets are to be jetted, such as, paper or the like.

Next, main characteristics of the liquid jet head 50 in accordance with the present embodiment are described.

According to the liquid jet head 50 in accordance with the present embodiment, a mixed crystal of lanthanum nickelate is used as the material for the orientation layer 7, such that the crystal orientation of the piezoelectric layer 5 can be controlled to a specified orientation, and characteristics, such as, the piezoelectric constant of the piezoelectric layer 5 can be improved. By this, the vibration plate 55 causes a greater amount of deflection, and therefore droplets can be more efficiently jetted. It is noted here that the term "efficiently" implies that an ink droplet in the same amount can be jetted by a lower voltage. In other words, the driving circuit can be simplified, and at the same time, the power consumption can be reduced, such that the nozzle apertures 511 can be formed at pitches with a higher density. Accordingly, high-density printing and high-speed printing become possible. Furthermore, the length of the major axis of the pressure chamber 521 can be shortened, such that the overall size of the head can be made smaller.

Moreover, by providing the orientation layer 7 composed of a mixed crystal of lanthanum nickelate as a main constituent, the liquid jet head 50 with considerably excellent aging characteristics can be obtained, as described below. More specifically, in accordance with the present embodiment, as is clear from experimental examples to be described below, by using a specific orientation layer 7, the rate of reduction in displacement in the aging process to be described below can be controlled within an extremely small range, as small as about 5%. Therefore, even after the aging process, members composing the liquid jet head 50, such as, for example, the piezoelectric elements 54 and the vibration plate 55 can be maintained in proximity to the initially designed values. Accordingly, the liquid jet head 50 in accordance with the present embodiment has excellent aging characteristics, such that the piezoelectric elements 54 and the vibration plate 55 can have extremely small aging variations in the amount of displacement, and therefore have excellent durability.

2. METHOD FOR MANUFACTURING LIQUID JET HEAD

2.1. Manufacturing Method

Next, a method for manufacturing a liquid jet head 50 in accordance with an embodiment of the invention is described with reference to FIG. 1 and FIGS. 5 through 7.

First, a silicon substrate 1 with a (110) orientation that becomes a base material for a pressure chamber substrate 52 is prepared.

Figure 5:
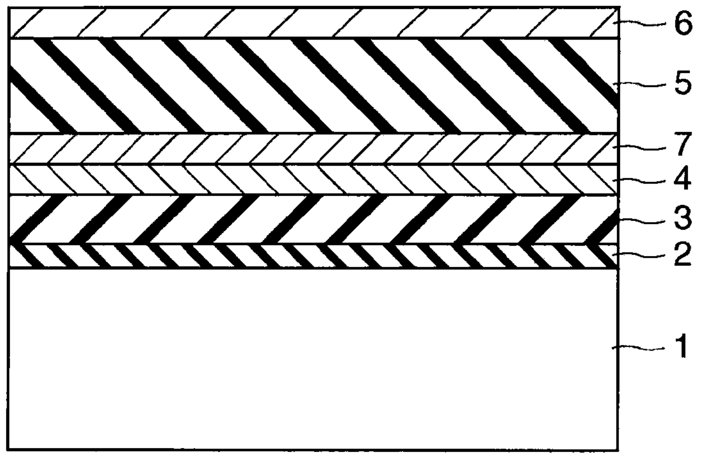
FIG. 5 schematically shows a step of a method for manufacturing a liquid jet head in accordance with an embodiment of the invention.

Next, as shown in FIG. 5, a dielectric layer 2 is formed on the silicon substrate 1. The dielectric layer 2 is composed of, for example, silicon oxide. The dielectric layer 2 composed of silicon oxide may be formed by, for example, a thermal oxidation method applied to the surface of the silicon substrate 1. Alternatively, the dielectric layer 2 may be formed by a CVD method or the like.

Next, an elastic layer 3 is formed on the dielectric layer 2. The elastic layer 3 may be formed by, for example, a CVD method, a sputter method, a vapor deposition method, or the like. As a material for the elastic layer 3, any one of the materials for the elastic layer 3 described above can be used.

Next, a lower electrode 4 is formed on the elastic layer 3. In accordance with the present embodiment, because an orientation layer 7 is provided, the crystal orientation of a conductive material composing the lower electrode 4 is not particularly limited, and therefore the fabrication condition and fabrication method for the lower electrode 4 can be suitably selected. For example, the lower electrode 4 may be formed by a sputter method, a vapor deposition method or the like. Also, the temperature at which the lower electrode 4 is formed may be, for example, room temperature to 600° C. As a material for the lower electrode 4, any one of the materials for the lower electrode 4 described above can be used.

Next, an orientation layer 7 is formed on the lower electrode 4. The orientation layer 7 may be formed by, for example, a sputter method. When the orientation layer 7 is formed by a sputter method, a rotary magnetron sputter method or a fixed sputter method may be used. A target to be used for the sputter method shall be described below.

When a rotary magnetron sputter method is used, the power may be set to 0.5-1.5 kW, and the film formation temperature may be set to 150° C.-600° C. According to the rotary magnetron sputter method, sputtering is conducted while rotating a magnet provided immediately below a target. The use of a rotary magnetron sputter method is advantageous in that erosions which may be caused by partially concentrated discharge to the target can be suppressed, and the target can be uniformly utilized without waste. When a fixed sputter method is used, the power may be set to 0.5-1.5 kW, and the film formation temperature may be set to 300° C.-600° C. The rotary magnetron sputter method may be more desirable than the fixed sputter method in view of the fact that the film forming temperature can be lowered. Also, in the sputter method, the rate of oxygen in argon and oxygen ($O_2/(Ar+O_2)$) may be set to, for example, 0% -50%.

Next, a piezoelectric layer 5 is formed on the orientation layer 7. The piezoelectric layer 5 may be formed by, for example, a sputter method, a sol-gel method or the like. As a material for the piezoelectric layer 5, any of the materials for the piezoelectric layer 5 described above may be used.

Then, an upper electrode 6 is formed on the piezoelectric layer 5. The upper electrode 6 may be formed by, for example, a sputter method, a vacuum deposition method or the like. As a material for the upper electrode 6, any of the materials for the upper electrode 6 described above may be used.

Figure 6:
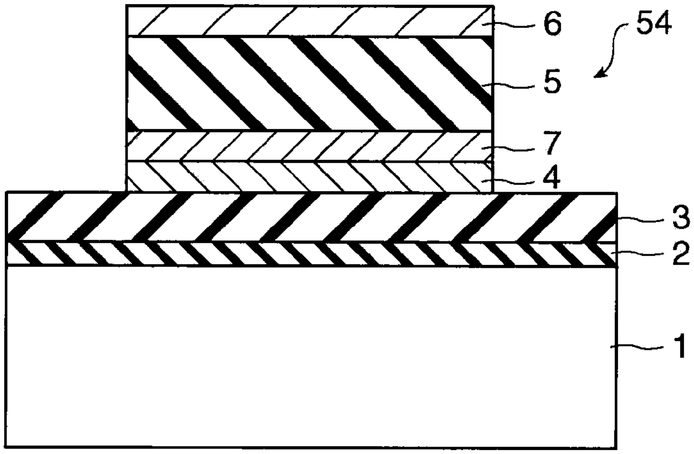
FIG. 6 schematically shows a step of the method for manufacturing a liquid jet head in accordance with the present embodiment.

Next, the upper electrode 6, the piezoelectric layer 5, the orientation layer 7 and the lower electrode 4 are patterned into a shape corresponding to each of the pressure chambers 521, as shown in FIG. 6, thereby forming piezoelectric elements 54 in a number corresponding to the number of pressure chambers 521. It is noted that, when the lower electrode 6 is used as a common electrode, the lower electrode 6 may be patterned independently.

Figure 7:
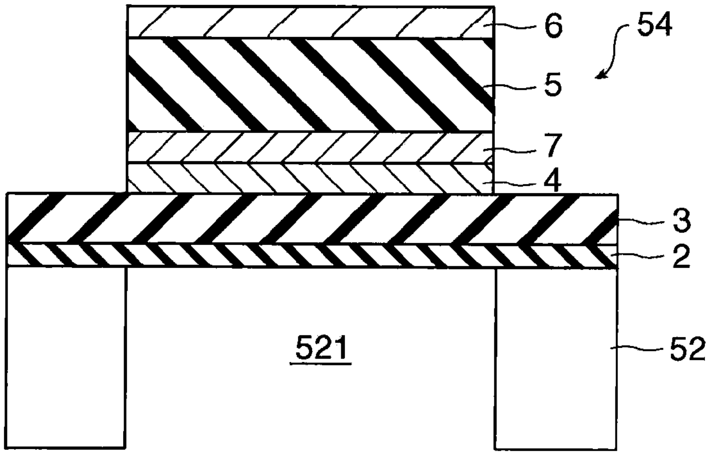
FIG. 7 schematically shows a step of the method for manufacturing a liquid jet head in accordance with the present embodiment.

Next, as shown in FIG. 7, the silicon substrate 1 is patterned by using a known lithography technique, thereby forming recessed sections that become pressure chambers 521 at positions corresponding to the piezoelectric elements 54, and recessed sections that become a reservoir 523 and supply ports 524 at predetermined positions, whereby the pressure chamber substrate 52 is formed.

In the present embodiment, a silicon substrate with a (110) orientation is used as the pressure chamber substrate 52, such that wet etching (anisotropic etching) using a highly concentrated alkaline solution is preferably used. In the case of wet etching with a highly concentrated alkaline solution, the dielectric layer 2 can function as an etching stopper, as described above. Therefore the pressure chamber substrate 52 can be more readily formed.

In this manner, the substrate 1 is etched to remove portions thereof in its thickness direction to the extent that the vibration plate 55 is exposed, thereby forming the pressure chamber substrate 52. It is noted that, in this instance, portions that remain without being etched become side walls 522.

Next, a nozzle plate 51 having a plurality of nozzle apertures 511 formed therein is bonded such that each of the nozzle apertures 511 is aligned to correspond to each of the recessed sections that become the respective pressure chambers 521. By this, the plurality of pressure chambers 521, the reservoir 523 and the plurality of supply ports 524 are formed. For bonding the nozzle plate 51, for example, a bonding method using adhesive, a fusing method, or the like can be used. Then, the pressure chamber substrate 52 is attached to the base substrate 56.

By the process described above, the liquid jet head 50 in accordance with the present embodiment can be manufactured.

Next, an aging treatment can be applied to the liquid jet head 50 obtained by the manufacturing method described above. For example, the aging process may be conducted as follows.

After the pressure chambers 521 have been formed, an aging process can be applied. The aging process includes the step of applying driving signals with a higher voltage and a higher frequency than those in practical use to the piezoelectric elements 54 in a predetermined number of pulses, thereby generating an electric field with a higher intensity than that in practical use in the piezoelectric layer 5 to drive the piezoelectric elements 54. By the aging process, changes in the amount of displacement of the piezoelectric elements 54 and the vibration plate 55 in practical use can be suppressed to a considerably small level, and therefore stable liquid jetting characteristics can always be obtained. In other words, by applying the aging process, the piezoelectric layers 5 composing the piezoelectric elements 54 are polarized, and the internal stress of the vibration plate is alleviated, such that variations in the amount of displacement of the piezoelectric elements 54 and the vibration plate 55 in the practical use can be suppressed to a considerably small level.

The electric field intensity to be generated in the piezoelectric layer 5 in the aging process is not particularly limited as long as the electric field intensity is higher than that in practical use, and may preferably be 300 kV/cm or higher. By using such an electric field intensity, the piezoelectric layers 5 can be polarized in a relatively short time. For example, in accordance with the present embodiment, by setting the maximum voltage of a driving signal to be applied to the piezoelectric element 54 to 50V, an electric field intensity of 455 kV/cm can be generated in the piezoelectric layer 5. Also, the frequency of the driving signal is not particularly limited as long as the frequency is higher than that in practical use, and may be about 50 kHz-200 kHz. If the frequency is too low, the aging process takes a long time, but if the frequency is too high, the piezoelectric elements 54 might be destroyed.

Also, the waveform of the driving signal may be a waveform with a single frequency, for example, a sine wave, a rectangular wave or the like. By using such a simple waveform, the piezoelectric element 54 can be driven a predetermined number of times in a relatively short time, and the aging time can be shortened. Also, the load on the piezoelectric elements 54 and the load on the driving circuit that drives the piezoelectric elements 54 can be suppressed. Furthermore, the number of pulses of the driving signal needs to be appropriately decided depending on the electric field intensity to be generated in the piezoelectric elements 54, the frequency of the driving signal and the like, and may preferably be at least 10 million pulses or higher. By this, the internal stress of the vibration plate 55 can be securely alleviated, and the piezoelectric layers 5 can be securely polarized. As a result, variations in the amount of displacement of the piezoelectric elements 54 and the vibration plate 55 in the practical use can be suppressed to a small level.

It is noted that a method described in Japanese Laid-open Patent Application (JP-A-2004-202849) filed by the applicant of the present application may be used for the aging process.

2.2. Target Used for Forming Orientation Layer 7

Next, a dielectric target used for forming the orientation layer 7 is described. The dielectric target may have characteristics similar to those of a dielectric target material described in Japanese Laid-open Patent Application JP-A-2007-051315 filed by the present applicant.

The dielectric target contains an oxide of lanthanum, an oxide of nickel and a silicon compound. Because the dielectric target contains an Si compound, the dielectric target becomes to be an excellent dielectric target with uniform quality and high insulation property. It is noted that the silicon compound may preferably be an oxide.

The dielectric target may be formed by the following method. The method is similar to the method described in the aforementioned Japanese Laid-open Patent Application 2007-051315.

First, the method includes the steps of mixing a lanthanum oxide and a nickel oxide to prepare a mixed powder and thermally treating and crushing the mixed powder to obtain a first powder; mixing the first powder with a solution containing a silicon source material, and then collecting powder to obtain a second powder; thermally treating and pulverizing the second powder to obtain a third powder; and thermally treating the third powder.

Figure 8:
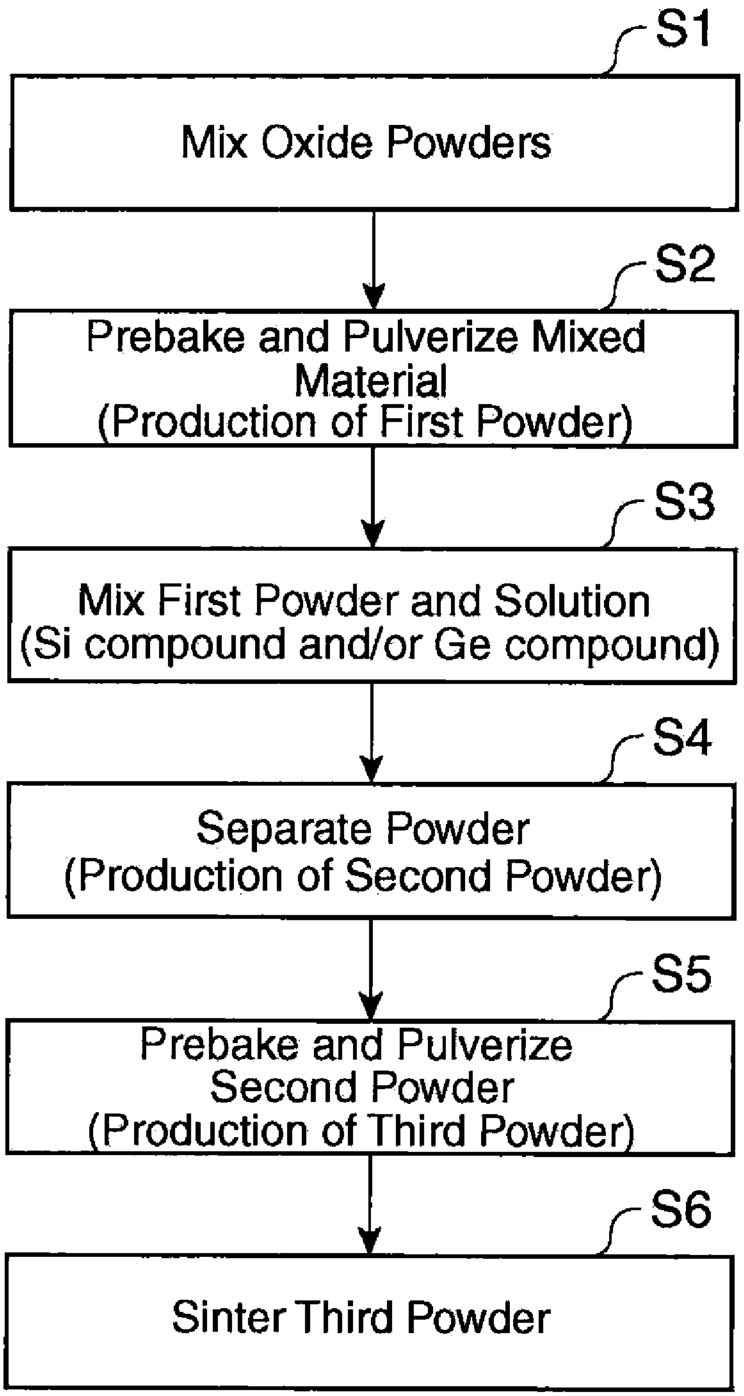
FIG. 8 is a chart showing a method for making a target to be used for a sputter method.

More concretely, the production method described above may include the steps shown in FIG. 8.

(1) Production of First Powder

Powder of lanthanum oxide and powder of nickel oxide are mixed, for example, at a composition ratio of 1:1 (step S1). Then, the obtained mixed material is prebaked at 900° C. to 1000° C., and then pulverized to obtain a first powder (step S2). The first powder thus obtained includes the lanthanum oxide and the nickel oxide.

(2) Production of Second Powder

The first powder and a solution containing a silicon source material are mixed (step S3). As the silicon source material, it is possible to use an alkoxide, an organic acid salt, an inorganic acid salt, or the like, which may be used as a precursor material for a sol-gel method or a MOD method. As the solution, a solution prepared by dissolving the silicon source material in an organic solvent such as an alcohol may be used. The silicon source material may be included in the solution in an amount of 2 mol % to 10 mol % of the conductive complex oxide to be obtained.

The silicon source material may preferably be liquid at room temperature or soluble in a solvent. As examples of the silicon source material, an organic salt, an alkoxide, an inorganic salt, and the like can be enumerated. As specific examples of the organic salt, a formate, acetate, propionate, butyrate, octylate, stearate, and the like of silicon can be enumerated. As specific examples of the alkoxide, an ethoxide, propoxide, butoxide, and the like of silicon can be enumerated. The alkoxide may be a mixed alkoxide. As specific examples of the inorganic salt, a hydroxide, chloride, fluoride, and the like of silicon can be enumerated. These source materials may be directly used when liquid at room temperature, or may be used after dissolving in another solvent. Also, many silicon salts may also be used, without being limited to the silicon source materials described above.

The powder and the solution are then separated by filtration or the like to collect powder, thereby obtaining a second powder (step S4). The resulting second powder is formed from a mixture of the first powder and the above solution.

(3) Production of Third Powder

Then, the second powder is prebaked at 900° C. to 1000° C., and then pulverized to obtain a third powder (step S5). The third powder thus obtained includes the lanthanum oxide, the nickel oxide and the silicon oxide.

(4) Sintering

Then, the third powder is sintered using a known method (step S6). For example, the third powder may be placed in a die and sintered by vacuum hot pressing. The sintering may be conducted at 1000° C. to 1500° C. In this manner, the dielectric target can be obtained.

(5) Polishing

The surface of the dielectric target obtained may be polished by wet polishing, if necessary.

Because the production method described above includes the step of mixing the first powder and a solution of silicon source material, a dielectric target with uniform quality and high dielectric property can be obtained. Also, according to the production method described above, it is possible to obtain a dielectric target by which a conductive complex oxide film to be obtained exhibits excellent crystal orientation controllability and surface morphology.

The target obtained by the production method described above may contain the lanthanum oxide and the nickel oxide at a ratio of 1 or a ratio near the foregoing ratio. Furthermore, the target may contain 2 mol % to 10 mol % silicon.

According to the method for manufacturing the liquid jet head 50 in accordance with the present embodiment, the orientation layer 7 composed of a mixed crystal of lanthanum nickelate can be formed by a sputter method. The liquid jet head 50 that includes the piezoelectric elements 54 having the orientation layers 7 has the characteristics described above.

3. EXPERIMENTAL EXAMPLE (1) Production of Target Used in Sputter Method

Dielectric targets to be used as an experimental example and a comparison experimental example were formed by the following method.

First, first powder was produced. More concretely, La oxide powder and Ni oxide powder were mixed at a composition ratio of 1:1. The obtained mixed material was prebaked at 900° C. to 1000° C. and then pulverized to obtain first powder.

Then second powder was produced. More concretely, the first powder and a silicon alkoxide solution were mixed. The silicon alkoxide solution was prepared by dissolving silicon alkoxide in an alcohol at a rate of 5 mol %.

The powder and the solution were then separated by filtration to obtain a second powder. The second powder was thus obtained by mixing the first powder and the above solution.

The second powder was prebaked at 900° C. to 1000° C. and then pulverized to obtain third powder.

The third powder was sintered by a known method. More concretely, the third powder was placed in a die and sintered using a vacuum hot pressing method. The sintering was conducted at 1400° C. In this manner, a target sample was obtained. It was confirmed that the target sample had a uniform surface and did not have any defects such as cracks.

(2) Film-Forming Temperature Dependence of Mixed Crystal of Lanthanum Nickelate (2)-1. Sample Film Formed at Low Temperature First, a sample 1 having a lanthanum nickelate film 1 formed by a rotary magnetron sputter method using the target sample described above shall be described.

The sample 1 was formed from a lanthanum nickelate film (hereafter referred to as a "lanthanum nickelate film 1") composed of a mixed crystal of lanthanum nickelate having a film thickness of 40 nm formed on a (110) oriented silicon substrate at a RF power of 1 kW, a substrate temperature of 200° C., and a gas ratio of $Ar/O_2$=30/20 sccm.

Figure 10:
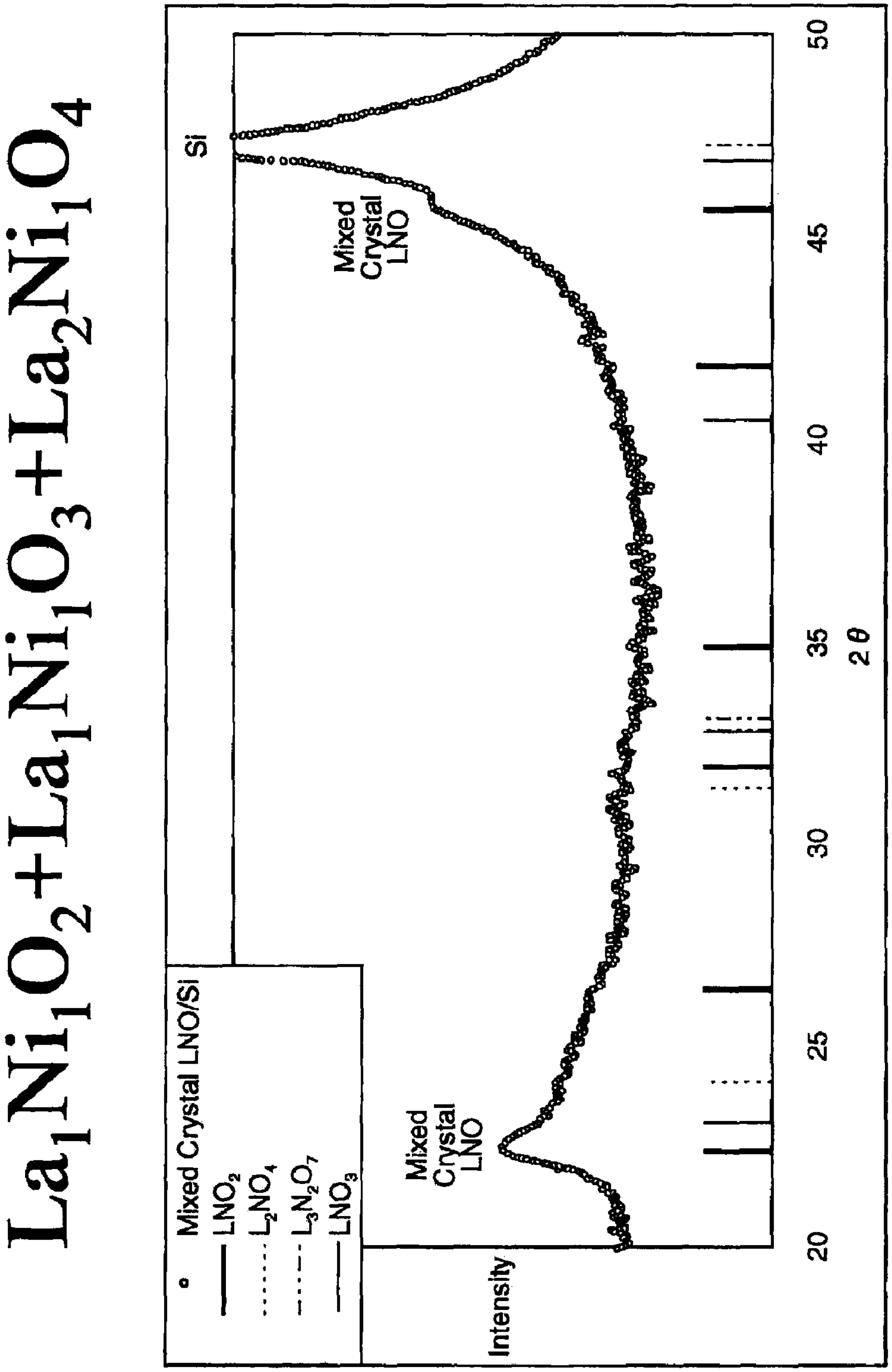
FIG. 10 shows a θ-2θ scanning X-ray diffraction pattern of a sample 1 having a lanthanum nickelate film in accordance with an experimental example.

FIG. 10 shows the result of X-ray diffractometry of the sample 1 according to a θ-2θ method using CuK α ray. It was confirmed from FIG. 10 that the mixed crystal of lanthanum nickelate (mixed crystal LNO) had a peak top position of a peak between 21° and 25° in diffraction angles 2θ. The peak between 21° and 25° was asymmetrical with respect to the peak top position. It was confirmed that the mixed crystal mainly contained $LaNiO_2$ (LNO2), $LaNiO_3$ (LNO3) and $La_2NiO_4$ (L2NO4). Further, the molar ratio of lanthanum to nickel (La/Ni) in the mixed crystal of lanthanum nickelate film 1 was examined by an ICP (Inductively Coupled Plasma) method, and it was confirmed to be 1.24.

A sample 2 having a lanthanum nickelate film 2 was formed on a laminate in a manner similar to the case of the silicon substrate described above, except that the substrate for forming the lanthanum nickelate film thereon was replaced with the laminate. The laminate used in this experimental example is composed of a silicon oxide layer (having a film thickness of about 1 μm), a zirconium oxide layer (having a film thickness of about 0.4 μm) and a platinum layer (having a film thickness of about 0.1 μm) formed on a (110) oriented silicon substrate.

Figure 11:
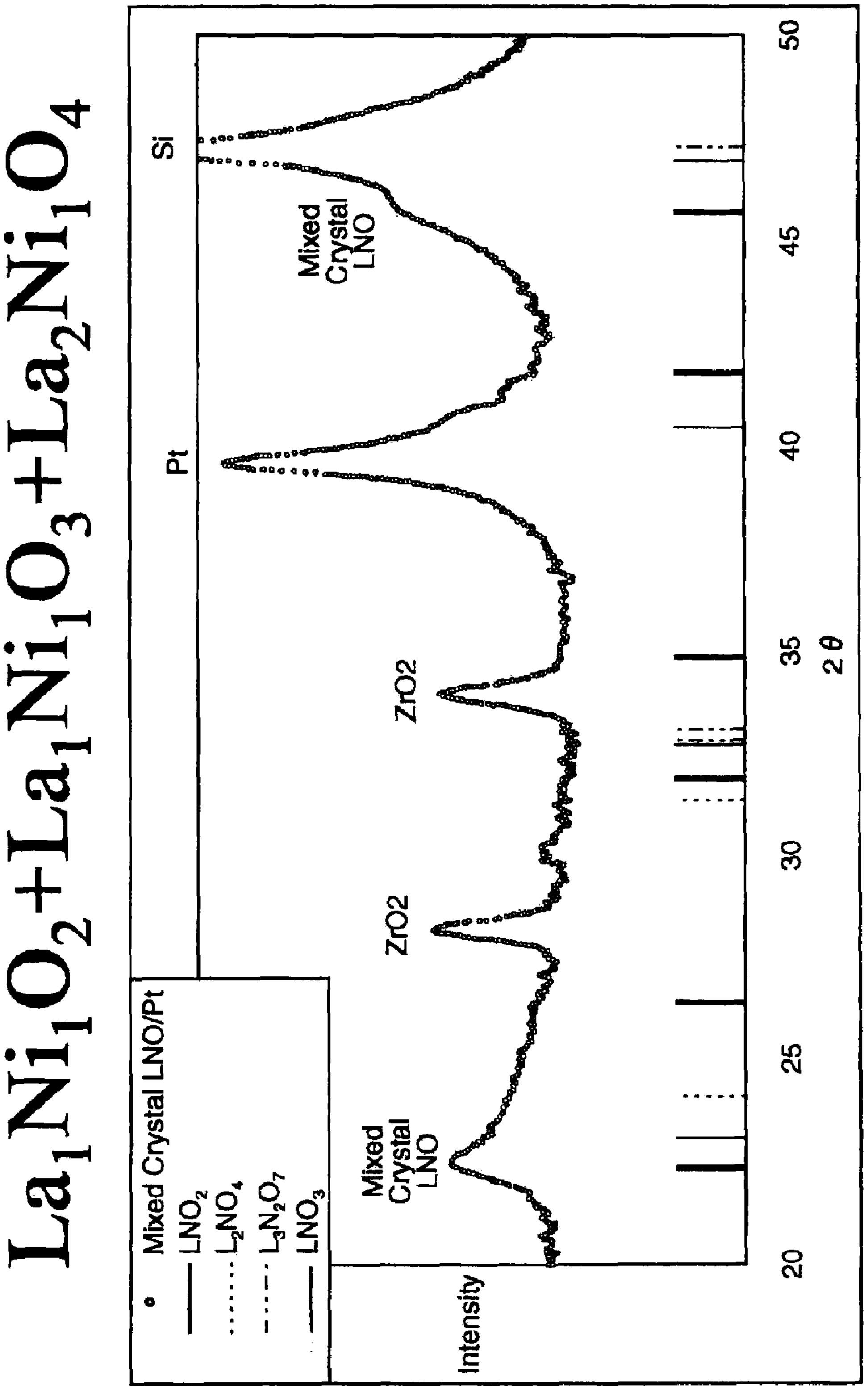
FIG. 11 shows a θ-2θ scanning X-ray diffraction pattern of a sample 2 having a lanthanum nickelate film in accordance with an experimental example.

FIG. 11 shows the result of X-ray diffractometry of the sample 2. It was confirmed from FIG. 11 that a peak top position of the mixed crystal of lanthanum nickelate (mixed crystal LNO) was located between 21° and 25° in diffraction angles 2θ, like FIG. 10. It was confirmed that the mixed crystal mainly included $LaNiO_2$ (LNO2), $LaNiO_3$ (LNO3) and $La_2NiO_4$ (L2NO4).

(2)-2. Sample Film Formed at High Temperature

First, a sample 3 having a lanthanum nickelate film 3 formed by a rotary magnetron sputter method using the target sample described above shall be described.

The sample 3 was formed from a lanthanum nickelate film 3 composed of a mixed crystal of lanthanum nickelate having a film thickness of 40 nm formed on a (110) oriented silicon substrate at a RF power of 1 kW, a substrate temperature of 550° C., and a gas ratio of $Ar/O_2$=30/20 sccm.

Figure 12:
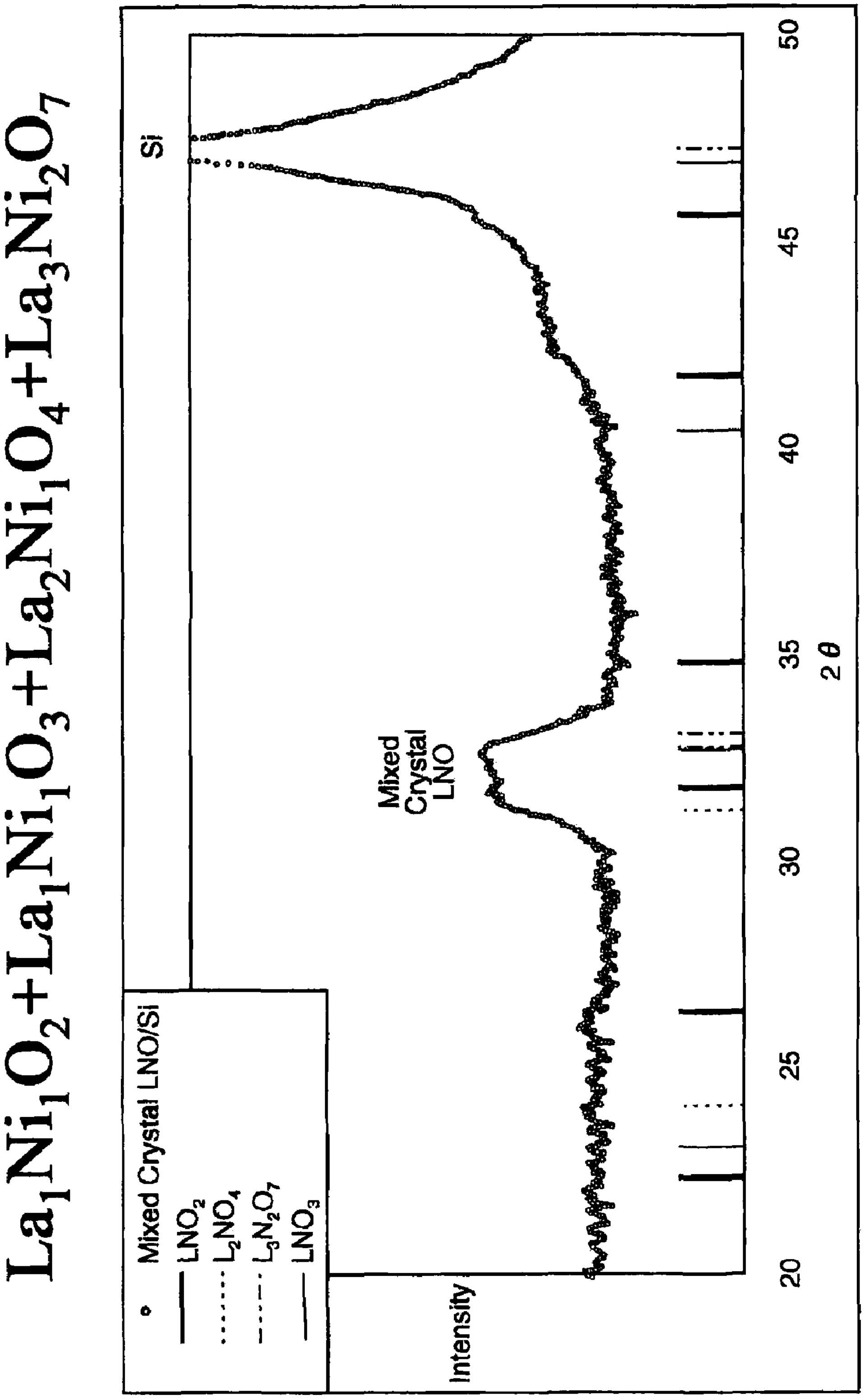
FIG. 12 shows a θ-2θ scanning X-ray diffraction pattern of a sample 3 having a lanthanum nickelate film in accordance with an experimental example.

FIG. 12 shows the result of X-ray diffractometry of the sample 3. It was confirmed from FIG. 12 that the mixed crystal of lanthanum nickelate (mixed crystal LNO) had a peak top position of a peak between 30° and 33° in diffraction angles 2θ. The peak between 30° and 33° was asymmetrical with respect to the peak top position. It was confirmed that the mixed crystal LNO mainly included $LaNiO_2$ (LNO2), $LaNiO_3$ (LNO3), $La_2NiO_4$ (L2NO4) and $La_3Ni_2O_7$ (L3N2O7). Further, the molar ratio of lanthanum to nickel (La/Ni) in the lanthanum nickelate film 3 was examined by an ICP method, and it was confirmed to be 1.54.

A sample 4 having a lanthanum nickelate film 4 was formed on a laminate in a manner similar to the case of the silicon substrate described above, except that the substrate for forming the lanthanum nickelate film thereon was replaced with the laminate. The laminate used in this experimental example was the same as the laminate described above in (2)-1. In other words, the laminated is composed of a silicon oxide layer, a zirconium oxide layer and a platinum layer formed on a (110) oriented silicon substrate.

Figure 13:
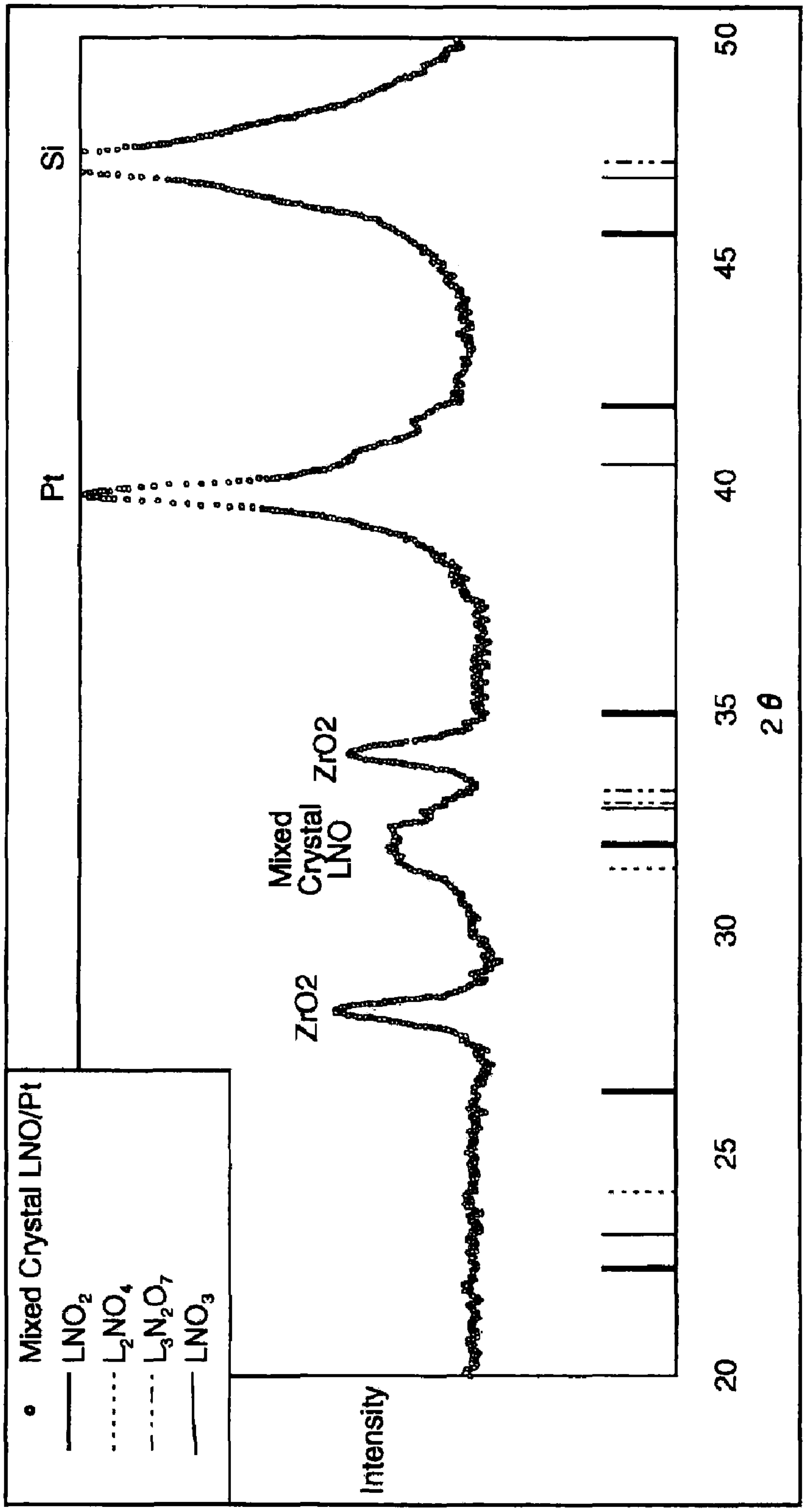
FIG. 13 shows a θ-2θ scanning X-ray diffraction pattern of a sample 4 having a lanthanum nickelate film in accordance with an experimental example.

FIG. 13 shows the result of X-ray diffractometry of the sample 4. It was confirmed from FIG. 13 that a peak of the mixed crystal of lanthanum nickelate (mixed crystal LNO) was located between 30° and 33° in diffraction angles 2θ, like FIG. 12. The peak between 30° and 33° was asymmetrical with respect to the peak top position. It was confirmed that the mixed crystal mainly contained $LaNiO_2$ (LNO2), $LaNiO_3$ (LNO3) and $La_2NiO_4$ (L2NO4).

In view of the above, it was confirmed that the compositions of the mixed crystal in the lanthanum nickelate films depended on the film forming temperatures. More concretely, it was confirmed that, when the film forming temperature was between 150° C. and 250° C., a mixed crystal mainly including $LaNiO_2$ (LNO2), $LaNiO_3$ (LNO3) and $La_2NiO_4$ (L2NO4) was obtained; and when the film forming temperature was between 400° C. and 600° C., a mixed crystal mainly including $LaNiO_2$ (LNO2), $LaNiO_3$ (LNO3), $La_2NiO_4$ (L2NO4) and $La_3Ni_2O_7$ (L3N2O7) was obtained. Moreover, depending on the film forming temperatures, compositions ratios of lanthanum to nickel in the mixed crystals become different.

(3) Orientation Dependence of Lanthanum Nickelate According to Sputter Methods

Figure 14:
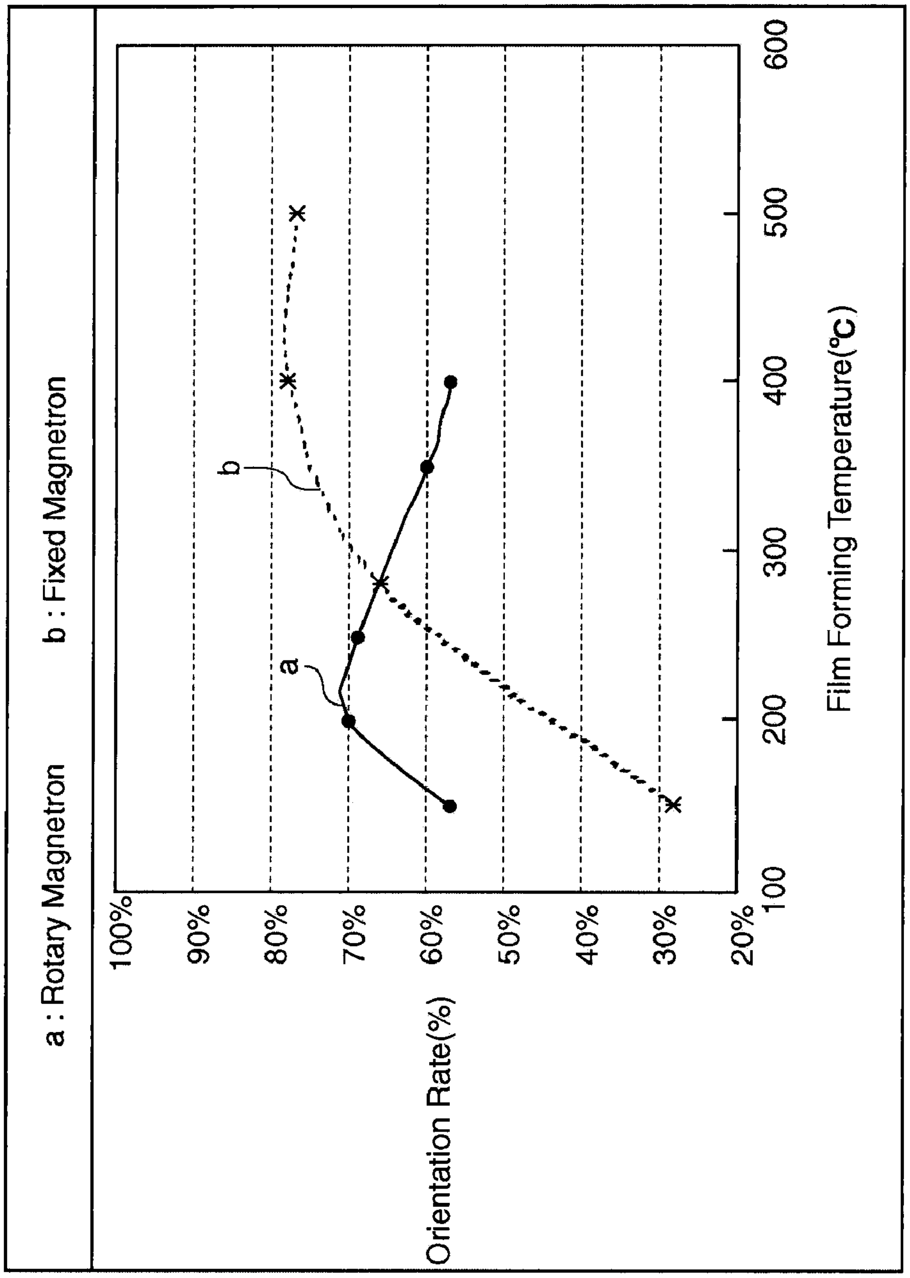
FIG. 14 is a graph showing the crystal orientation dependence of lanthanum nickelate according to sputter methods in samples in accordance with experimental examples.

FIG. 14 is a graph showing the relation between film forming temperatures and crystal orientation rates when using a rotary magnetron sputter method and a fixed sputter method. When the intensity at the peak top position between 21° and 25° in diffraction angles 2θ when examined by X-ray diffractometry according to a θ-2θ method using CuK α ray is defined as "Mixed crystal LNO Intensity A," and the intensity at the peak top position between 30° and 33° is defined as "Mixed Crystal LNO Intensity B," the orientation rate shown in FIG. 14 can be expressed as:

Orientation rate=Mixed crystal LNO Intensity A/(Mixed crystal LNO Intensity A+Mixed Crystal LNO Intensity B)

In FIG. 14, the mark a indicates a graph obtained when a rotary magnetron sputter method was used, and the mark b indicates a graph obtained when a fixed sputter method was used.

It was found from FIG. 14 that, when the rotary magnetron sputter method was used, orientation rates greater than about 60% could be obtained when the film forming temperature was about 150° C. to 350° C.

In contrast, when the fixed sputter method was used, it was found that orientation rates greater than about 60% could be obtained when the film forming temperature was about 250° C. or higher.

(4) Crystal Orientation of Piezoelectric Layer

Crystal orientations of piezoelectric layers that used a mixed crystal film of lanthanum nickelate as an orientation layer and did not use such a mixed crystal film were examined, and the obtained results shall be described below.

(4)-1. Experimental Example with Orientation Layer

A film of lanthanum nickelate having a film thickness of 40 nm was formed on a platinum layer by a rotary magnetron sputter method with the same conditions described above in (2)-1. Further, a PZT layer was formed to a thickness of 1.3 μm by a sol-gel method on the lanthanum nickelate. The PZT layer was formed as follows. First, a sol-gel source material was coated on the platinum layer, then prebaked at 100° C.-150° C., then degreased at 400° C., and then further sintered at 700° C. in an oxygen atmosphere. The foregoing steps were repeated until a desired film thickness was obtained, thereby forming the PZT layer. The laminate thus obtained is referred to a sample 5.

Figure 15:
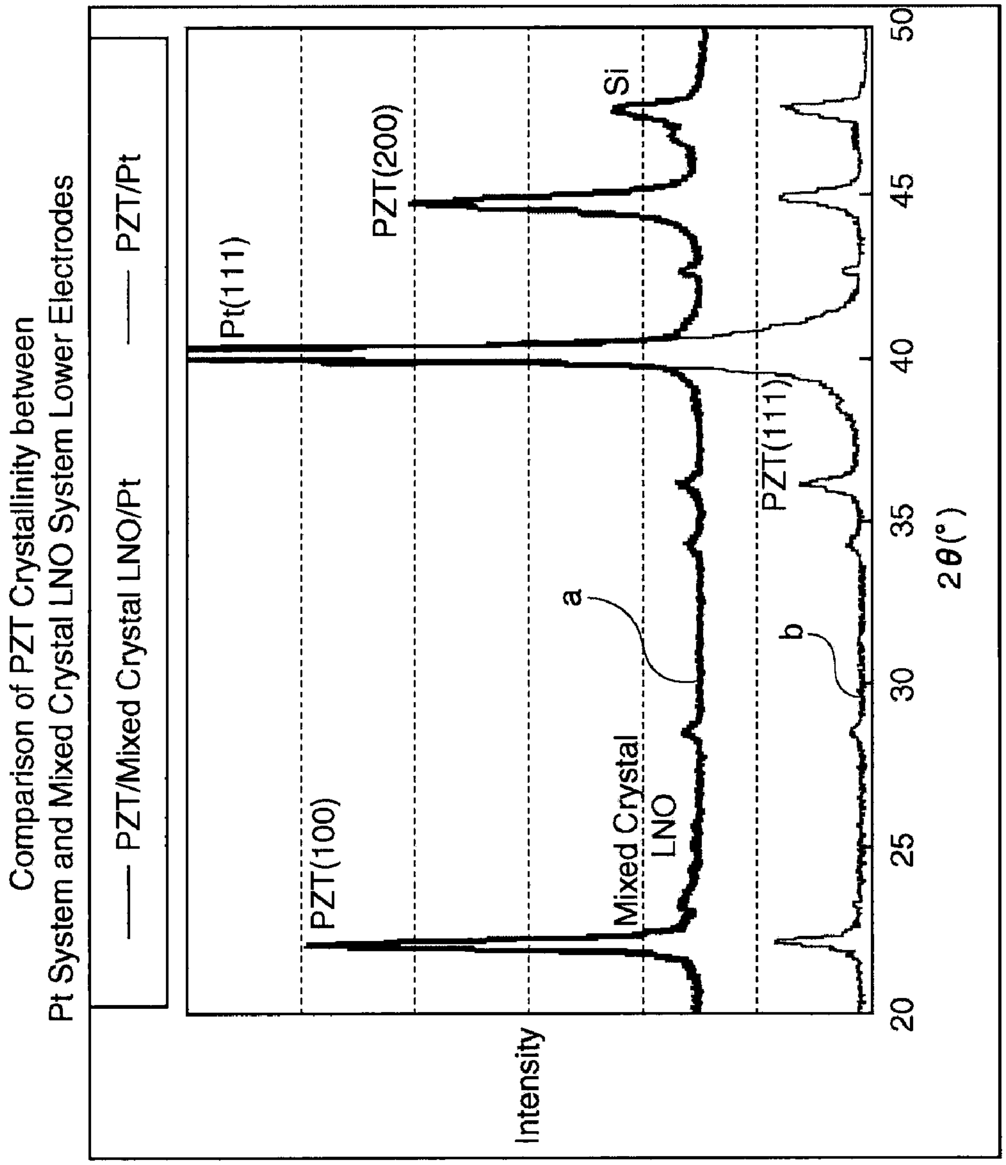
FIG. 15 shows θ-2θ scanning X-ray diffraction patterns of samples in accordance with an experimental example and a comparison experimental example.

A graph indicated by the mark a in FIG. 15 shows the result of X-ray diffractometry of the sample 5 according to a θ-2θ method using CuK α ray. It was confirmed from FIG. 15 that the sample 5 had a strong peak top position originated from PZT of the piezoelectric layer. Further, the orientation rate of the PZT (100) was obtained from the result of diffractometry shown in FIG. 15, which was 96-99. It is noted here that, when the intensity at the peak top position between 21° and 25° in diffraction angles 2θ when examined by X-ray diffractometry according to a θ-2θ method using CuK α ray is defined as "PZT (100) Intensity," the intensity at the peak top position between 30° and 33° is defined as "PZT (110) Intensity," and the intensity at the peak top position between 37° and 39° is defined as "PZT (111) Intensity," the orientation rate of PZT (100) can be expressed as:

Orientation rate of PZT (100)=PZT (100) Intensity/(PZT (100) Intensity+PZT (110) Intensity+PZT (111) Intensity)

Further, a full width half maximum of the PZT (200) was obtained by a rocking curve method using CuK α ray, which was 10.4°.

(4)-2. Experimental Example Without Orientation Layer

A sample was obtained in a manner similar to the sample described above in (4)-1, except that a titanium layer of 4 nm thickness was used as a seed layer formed on a platinum layer, instead of using an orientation layer composed of a mixed crystal of lanthanum nickelate. The laminate thus obtained is referred to as a comparison sample 6.

A graph indicated by the mark b in FIG. 15 shows the result of X-ray diffractometry of the sample 6 according to a θ-2θ method using CuK α ray. It was confirmed from FIG. 15 that the comparison sample 6 had a peak originated from PZT of the piezoelectric layer, but the peak was smaller than that of the sample 5. Further, the orientation rate of the PZT (100) was obtained from the result of diffractometry shown in FIG. 15, which was 90-95. Further, a full width half maximum of the PZT (200) was obtained, which was 22.4°.

In light of the above, it was confirmed that the sample 5 in accordance with the present experimental example had a higher crystal orientation property in the PZT layer, a smaller full width half maximum, and more aligned crystal axes, compared to the comparison sample 6.

(5) Dielectric Strength Test for Different Orientation Layers

Figure 16:
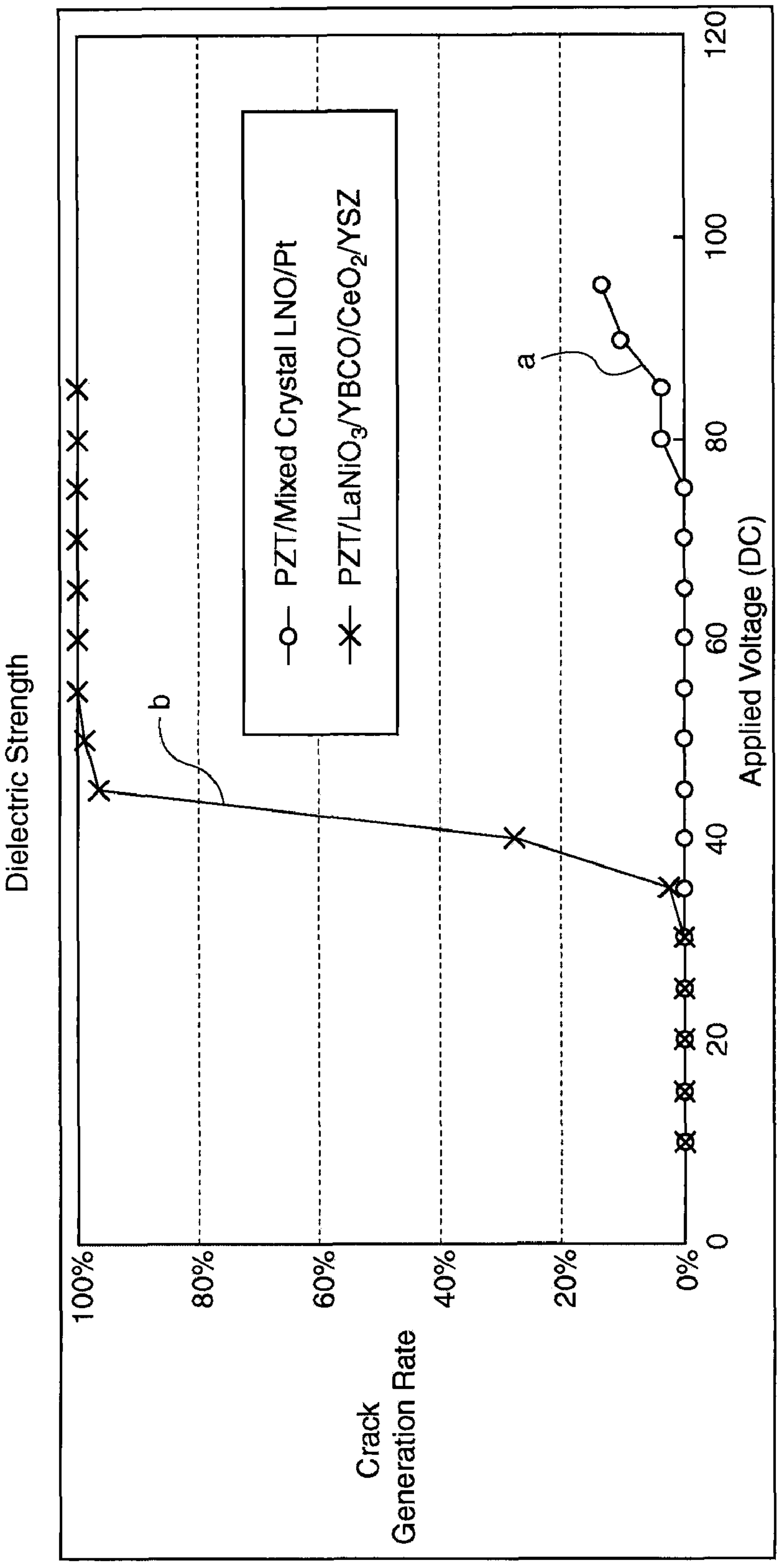
FIG. 16 shows dielectric strength characteristics of samples in accordance with an experimental example and a comparison experimental example.

Dielectric strength tests were conducted on a sample 7 that used a mixed crystal of lanthanum nickelate in accordance with the present embodiment as an orientation layer, and a comparison sample 8 that used a layer of $LaNiO_3$ as an orientation layer. The dielectric strength tests shall be described below. The results are shown in FIG. 16. In FIG. 16, a graph indicated by the mark a shows the result of the sample 7, and a graph indicated by the mark b shows the result of the sample 8.

By changing the voltage applied to the sample 7 that was manufactured in a manner similar to the sample 2 described above in (2)-1, generation of cracks was investigated. As a result, it was confirmed that, even when a voltage of about 80V was applied, almost no crack was generated in the piezoelectric layer (PZT layer) in the sample 7, and the piezoelectric element was not destroyed.

In contrast, in the comparison sample 8 that used $LaNiO_3$ as an orientation layer, cracks started generating in the piezoelectric layer at about 35V, and the piezoelectric element was destroyed at about 40V. It is noted that the comparison sample 8 was formed by forming YBCO/$CeO_2$/YSZ buffer layers on a Si substrate by a PLD (Pulse Laser Deposition) method, and epitaxially growing a (100) oriented lanthanum nickelate film ($LaNiO_3$) thereon.

(6) Aging Characteristic

Figure 17:
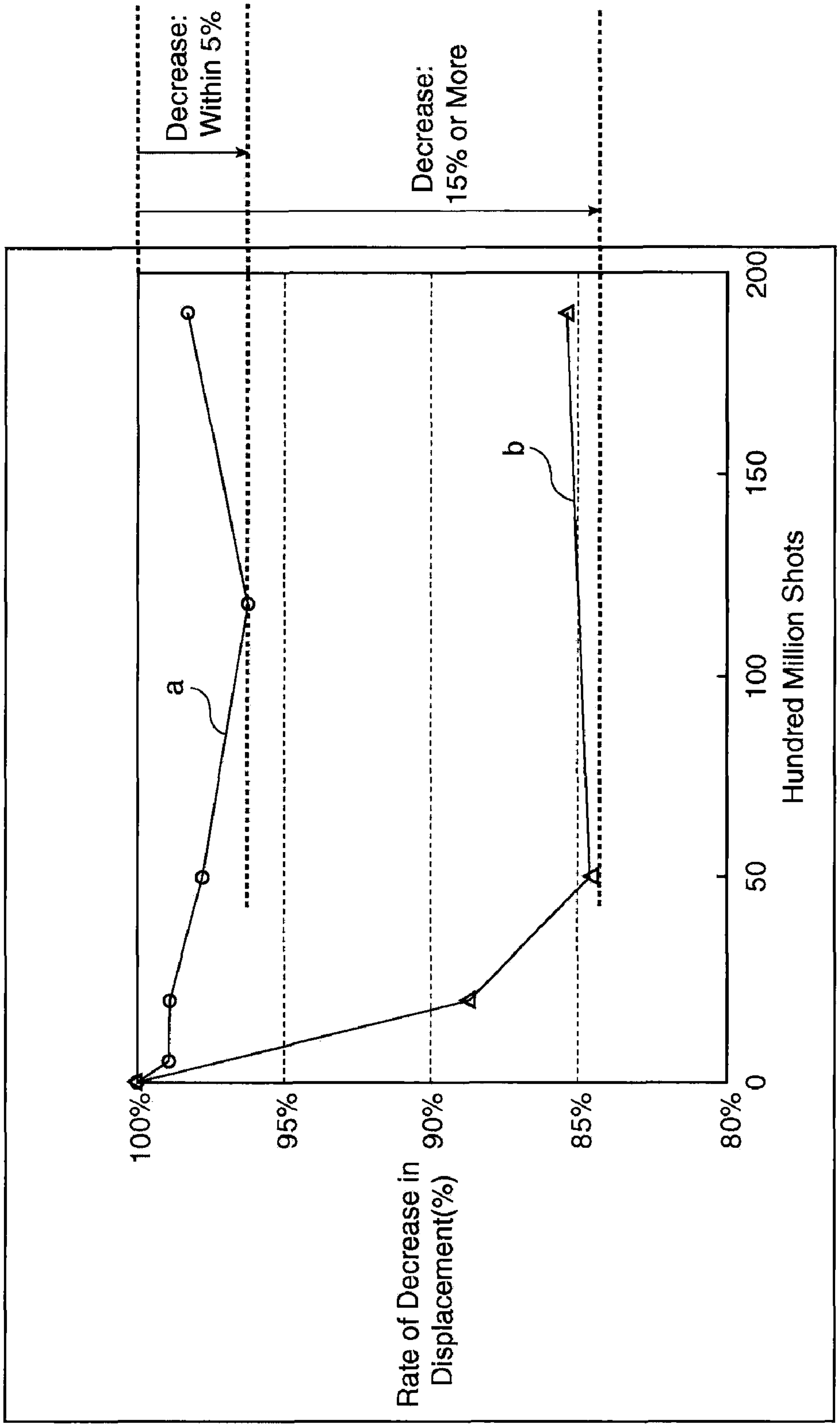
FIG. 17 shows aging characteristics of samples in accordance with an experimental example and a comparison experimental example.

Aging characteristics were examined for a sample 9 that was manufactured in the same manner as the sample 2, and a comparison sample 10 that was manufactured in a manner similar to the sample 2, except that a titanium layer was used as a seed layer, instead of using an orientation layer composed of lanthanum nickelate. The results are shown in FIG. 17. In FIG. 17, the driving frequency (shots) is plotted along the axis of abscissas, and the rate of decrease in displacement from the initial state is plotted along the axis of ordinates. In FIG. 17, a graph indicated by the mark a shows the result of the sample 9, and a graph indicated by the mark b shows the result of the comparison sample 10.

Experimental conditions for investigating the aging characteristics were set to be severer than those in actual use. More specifically, the aging tests were conducted at an electric field intensity of 300 kV/cm, and a driving signal frequency of 50 kHz.

It is observed in FIG. 17 that the sample 9 had a rate of decrease in displacement within 5%. In contrast, the comparison sample 10 had a rate of decrease in displacement over 15%. It is confirmed from the above that the sample of the present experimental example had a considerably smaller rate of decrease in displacement in the aging process compared to the comparison sample.

4. LIQUID JET APPARATUS

Figure 9:
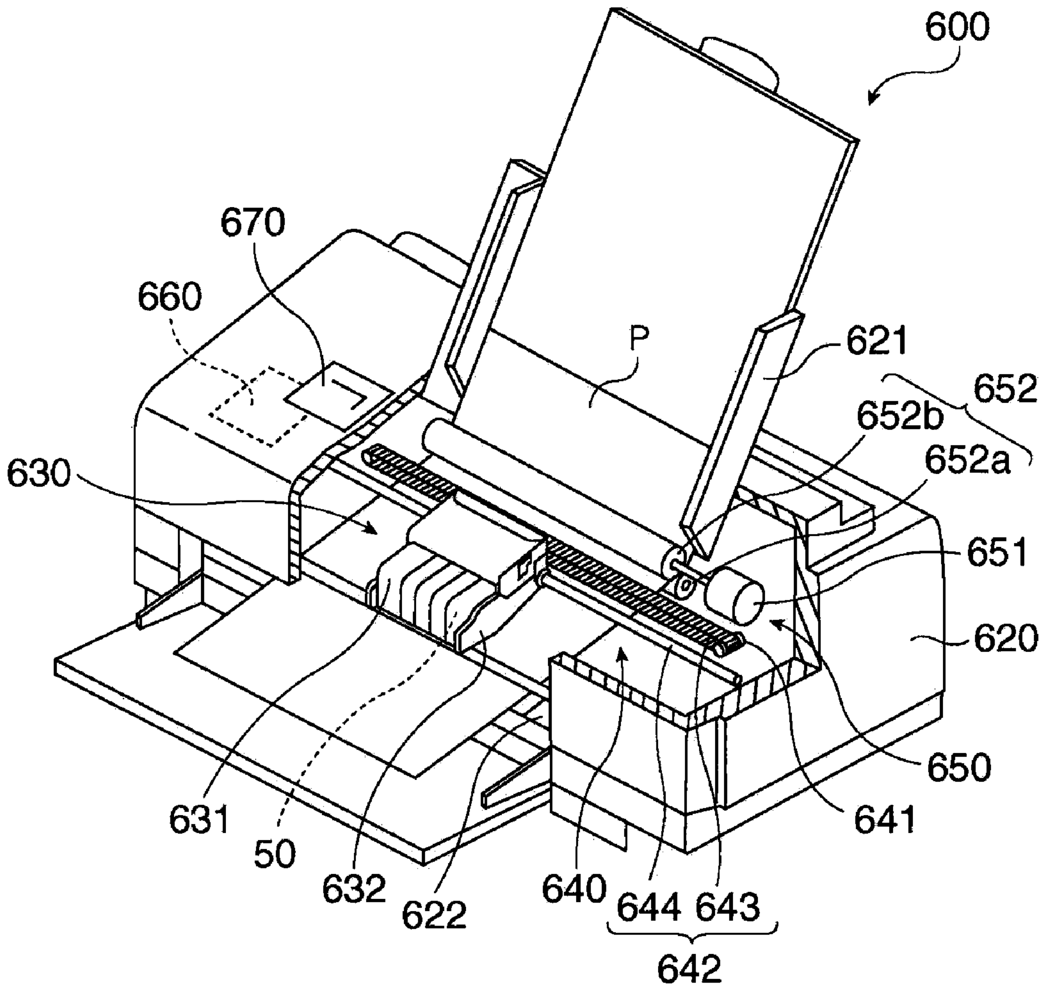
FIG. 9 is a view schematically showing a structure of an ink jet printer in accordance with an embodiment of the invention.

Next, an ink jet printer is described as an example of a liquid jet apparatus. More specifically, an ink jet printer in accordance with an embodiment having the liquid ejection head 50 in accordance with the present embodiment shall be described. FIG. 9 is a schematic view of a structure of an ink jet printer 600 in accordance with the present embodiment. The ink jet printer 600 can function as a printer capable of printing on paper or other media. In the following description, the upper side in FIG. 9 is referred to an “upper section” and the lower side is referred to a “lower section.”

The ink jet printer 600 includes an apparatus main body 620, a tray 621 for holding recording paper P in its upper rear section, a discharge port 622 for discharging recording paper P in the lower front section, and an operation panel 670 disposed on an upper surface of the apparatus main body 620. The recording paper P is an example of media on which liquid is ejected.

The apparatus main body 620 mainly includes therein a printing device 640 having a head unit 630 that is capable of reciprocal movements, a paper feeding device 650 that feeds the recording paper P one by one to the printing device 640, and a control section 660 that controls the printing device 640 and the paper feeding device 650.

The printing device 640 includes a head unit 630, a carriage motor 641 that is a driving source for the head unit 630, and a reciprocating mechanism 642 that receives rotations of the carriage motor 641 to reciprocate the head unit 630.

The head unit 630 includes, at its lower section, a liquid jet head 50 having a plurality of nozzle apertures 511 described above, ink cartridges 631 that supply inks to the liquid jet head 50, and a carriage 632 on which the liquid jet head 50 and the ink cartridges 631 are mounted.

The reciprocating mechanism 642 includes a carriage guide shaft 644 with its both ends being supported by a frame (not shown), and a timing belt 643 that extends in parallel with the carriage guide shaft 644. The carriage 632 is supported by the carriage guide shaft 644, in a manner that the carriage 632 can be freely reciprocally moved. Further, the carriage 632 is affixed to a portion of the timing belt 643. By operations of the carriage motor 641, the timing belt 643 is moved in a forward or reverse direction through pulleys, and the head unit 630 is reciprocally moved, guided by the carriage guide shaft 644. During these reciprocal movements, the ink is jetted from the head 50 and printed on the recording paper P.

The paper feeding device 650 includes a paper feeding motor 651 as its driving source and a paper feeding roller 652 that is rotated by operations of the paper feeding motor 651. The paper feeding roller 652 is equipped with a follower roller **652*a* and a driving roller 652*b* that are disposed up and down and opposite to each other with a feeding path of the recording paper P being interposed between them. The driving roller 652*b* is coupled to the paper feeding motor 651**.

Because the ink jet printer 600 in accordance with the present embodiment has the liquid jet head 50 in accordance with the present embodiment that is highly efficient and can arrange nozzles at a high density, high-density printing and high-speed printing become possible. Furthermore, the ink jet printer 600 in accordance with the present embodiment has the liquid jet head 50 that excels in the aging characteristics, such that high precision printing can be performed for an extended period of time.

The ink jet printer 600 in accordance with the invention can also be used as an industrial liquid ejection apparatus. As the liquid (liquid material, ink and the like) to be jetted in this case, a variety of liquids each containing a functional material whose viscosity is adjusted by a solvent or a disperse medium may be used.

Embodiments of the invention are described above in detail. However, those having ordinary skill in the art should readily understand that many modifications can be made without departing in substance from the new matters and effects of the invention. Accordingly, all of those modified examples are deemed included in the scope of the invention. For example, the piezoelectric elements in accordance with the invention are applicable not only to liquid jet heads described above, but also to a variety of other devices.

What is claimed is:

1. A liquid jet head comprising:

a nozzle plate having a nozzle opening;

a pressure chamber substrate having a pressure chamber communicating with the nozzle opening and formed above the nozzle plate;

a vibration plate formed on one side of the pressure chamber substrate; and a piezoelectric element formed above the vibration plate and provided at a position corresponding to the pressure chamber, wherein the piezoelectric element includes two electrodes, a piezoelectric layer provided between the electrodes, and an orientation layer that is provided between one of the electrodes closer to the vibration plate and the piezoelectric layer, wherein the orientation layer includes a mixed crystal comprising $LaNiO_2$, $LaNiO_3$, $La_2NiO_4$ and $La_3Ni_2O_7$, or a mixed crystal comprising $LaNiO_2$, $LaNiO_3$ and $La_2NiO_4$.

2. The liquid jet head according to claim 1, wherein the mixed crystal has a peak top position of a peak between 21° and 25° in diffraction angles 2θ when examined by X-ray diffractometry according to a θ-2θ method using CuK α ray.

3. The liquid jet head according to claim 2, wherein, when an integrated value of intensity of the peak from the peak top position to 21° is $I_A$, and an integrated value of intensity of the peak from the peak top position to 25° is $I_B$, a relation $I_A>I_B$ or $I_A<I_B$ is established.

4. The liquid jet head according to claim 1, wherein the mixed crystal includes $LaNiO_2$, $LaNiO_3$ and $La_2NiO_4$.

5. The liquid jet head according to claim 1, wherein the mixed crystal has a peak top position of a peak between 30° and 34° in diffraction angles 2θ when examined by X-ray diffractometry according to a θ-2θ method using CuK α ray.

6. The liquid jet head according to claim 5, wherein, when an integrated value of intensity of the peak from the peak top position to 30° is $I_C$, and an integrated value of intensity of the peak from the peak top position to 33° is $I_D$, a relation $I_C>I_D$ or $I_C<I_D$ is established.

7. The liquid jet head according to claim 1, wherein the mixed crystal includes $LaNiO_2$, $LaNiO_3$, $La_2NiO_4$ and $La_3Ni_2O_7$.

8. The liquid ejection apparatus comprising:

a media transfer mechanism that supplies and transfers a medium on which droplets are to be jetted; and a control section that supplies droplets from the liquid jet head recited in claim 1 at specified positions on the medium supplied by the media transfer mechanism.

* * * * *